United States Patent [19]

Gordon

[11] Patent Number: 4,730,327

[45] Date of Patent: Mar. 8, 1988

[54] DUAL CHANNEL FABRY-PEROT LASER

[75] Inventor: Eugene I. Gordon, Convent Station, N.J.

[73] Assignee: Lytel Incorporated, Somerville, N.J.

[21] Appl. No.: 809,577

[22] Filed: Dec. 16, 1985

[51] Int. Cl.$^4$ ............................ H01S 3/19; H01S 3/08
[52] U.S. Cl. ........................................ 372/45; 372/46; 372/49; 372/50; 372/92; 372/96; 372/97; 372/108; 357/16; 357/17
[58] Field of Search ....................... 372/44, 50, 45, 46, 372/49, 93, 92, 96, 97, 108; 357/17, 16

[56] References Cited

FOREIGN PATENT DOCUMENTS 0214579 10/1985 Japan ..................................... 372/49

OTHER PUBLICATIONS

Ito et al., "Active Q-Switching of Latercoil Field Coupling Control D.H. Laser", Electronics Letters, Oct. 23, 1980, vol. 16, No. 22, pp. 846–847.
Otsuka, "A Proposal on Coupled Waveguide Lasers", IEEE J. Quantum Electron, vol. Q.E.-13, No. 11, Nov. 1977, pp. 895–898.
D. Botez, "Laser Diodes are Powered-Packed", IEEE Spectrum, Jun. 1985. pp. 43–53.

Primary Examiner—William L. Sikes
Assistant Examiner—Georgia Y. Epps
Attorney, Agent, or Firm—Marmorek, Guttman & Rubenstein

[57] ABSTRACT

A semiconductor laser diode comprising first and second parallel optically coupled waveguides is disclosed. The waveguides extend between first and second partially reflecting end facets. The first waveguide terminates at the first facet with a high reflection coating and at the second facet with an anti-reflection coating. The second waveguide terminates at the first facet with an anti-reflection coating and at the second facet with a high reflection coating. Thus, the feedback path for the laser involves portions of both waveguides and the coupling region therebetween. As a result, no standing waves are set up in either waveguide near the portions of the end facets which are anti-reflection coated and from which radiation is emitted so that processes which cause emitting facets to fail at high powers are mitigated. When the two waveguides are slightly different geometrically and are coupled by a periodic structure, laser oscillations are sustainable only in a narrow frequency band centered about a frequency which is relatively insensitive to changes in pumping current so that the laser may be directly modulated with a relatively small FM to AM ratio.

10 Claims, 5 Drawing Figures

DUAL CHANNEL FABRY-PEROT LASER

FIELD OF THE INVENTION

This invention relates to semiconductor laser diodes and, more particularly, to semiconductor laser diodes having a feedback path comprising portions of two adjacent parallel waveguides and a coupling region therebetween.

BACKGROUND OF THE INVENTION

Semiconductor laser diodes find a wide variety of uses in such fields as optical communications, optical memories, and high speed printing.

The most common type of semiconductor laser is the double heterostructure. The double heterostructure comprises a pair of relatively wide bandgap cladding layers of opposite conductivity type and a relatively narrow bandgap active layer located between the cladding layers. Typically, the active layer is low-doped or intrinsic. Such double heterostructures are usually formed using the AlGaAs materials system wherein the cladding layers comprise $Al_xGa_{1-x}As$, where x is about 0.25 to about 0.35 and the active layer comprises GaAs or $Al_yGa_{1-y}As$ where y<0.1. The layers are deposited on a GaAs substrate. Alternatively, the InP-InGaAsP materials system may be used for double heterostructures.

When the p-i-n structure formed by the cladding layers and the active layer is forward biased, electrons and holes are injected into and trapped in the active layer where efficient radiative recombination takes place. The wavelength band of the emitted radiation is determined by the bandgap of the active layer. In many lasers the emitted radiation is amplified as it travels back and forth between partially reflecting crystal facets at each end of the laser diode. The radiation is guided by a dielectric waveguide. Transverse confinement is provided by the cladding layers. Lateral confinement is provided by any of the common index guiding structures such as ridges or V-grooves. Thus, the crystal facets define a Fabry-Perot waveguide resonator which supplies frequency selective feedback for radiation emitted in the active layer. When the unsaturated round trip optical gain exceeds losses due to mechanisms such as scattering, absorption, and facet transmission, laser oscillations at a number of selected frequencies result. A coherent beam is emitted by one or both end facets of the laser. The advantages of the double heterostructure laser are discussed in Botez, "Laser Diodes are Power-Packed", *IEEE Spectrum*, June, 1985, pp. 43–54.

There are several problems which result from the use of partially reflecting crystal facets of a semiconductor body to provide the feedback necessary to sustain laser oscillations.

First, the available output power of the diode laser may be limited by damage to the facets. If an AlGaAs diode laser emits continuous wave optical power densities in excess of 6 to 9 mW per square micrometer of emitting area, the internal laser power density becomes so high that chemical reactions occur at the partly reflective crystal facets from which the light emerges. This causes the facet region to gradually darken (become absorbing), apparently the effect of a layer of amorphous oxide formed by a photo-chemical reaction. Over time the laser's output power at constant current, degrades. The use of a passivating dielectric layer applied immediately after cleaving to form the facets can reduce the rate of window darkening. The passivating layer is typically a half wavelength in thickness, leaving the reflectivity of the facet unchanged.

In addition, laser light is absorbed, rather than amplified, near the facets because of non-radiative recombination of carriers at the facets, where the semiconductor material is terminated. At high optical power densities (20 to 25 mW per square micrometer) heavy light absorption in conjunction with non-radiative recombination induces a thermal runaway process, causing the end facets to melt, thereby catastrophically damaging the laser. The output power limits imposed by the gradual or catastrophic degradation of the laser diode's crystal end facets are lower as a result of a standing wave which is set up in the laser waveguide between the end facets which, as indicated above, form a Fabry-Perot resonator. The standing wave has a higher optical power at its antinodes than would a traveling wave. An antinode typically occurs right at the facet. This enhances the power dependent failure mechanisms. One solution is the use of an antireflection coated facet at the output end to reduce the amplitude of the standing wave. However, this significantly increases the laser current threshold and is only partially effective.

Besides failing at high output powers, a second problem with Fabry-Perot resonators formed by crystal end facets, is that such resonators provide feedback over a broad frequency range. Because the active layer has gain over a relatively large frequency band, diode lasers incorporating such Fabry-Perot resonators have multi-frequency output and are not really suitable for high bit rate optical communications, which require that the laser output be restricted to a very narrow frequency spectrum.

One effective approach to producing a double heterostructure semiconductor diode laser having a narrow frequency spectrum involves the use of a distributed periodic reflecting structure to supply feedback, instead of a Fabry-Perot resonator. In the distributed feedback laser, feedback occurs at only one frequency and this is the frequency of oscillation. The oscillation frequency is $$f_o = \tfrac{1}{2} V_p / \Lambda$$

where $V_p$ is the phase velocity of the radiation in the waveguide and $\Lambda$ is the period of the distributed periodic reflecting structure. For laser oscillations to be sustained, the frequency $f_o$ must fall within the bandwidth in which the active layer has net positive gain.

However, such distributed feedback lasers are difficult to amplitude modulate at high speed without introducing undesirable frequency modulation. As the laser pumping current is varied to turn the laser on and off or to vary the output power, the concentration of charge carriers in and near the active layer varies, thereby causing variations in the gain of the laser. Generally speaking, such changes in the gain are accompanied by small changes in the index of refraction (the well known Kramers-Kronig relation and plasma effects). These change the phase velocity of the light propagating in the waveguide. As indicated above, the frequency of oscillation in distributed feedback lasers is proportional to the phase velocity. Thus, the optical pulses produced by the laser, necessarily exhibit frequency shifts or chirping during the pulse, limiting the useful bit rate at which the laser can be modulated. In other words, variations in the pumping current to achieve amplitude modulation, result in a frequency modulated optical signal with an undesirably high FM to AM ratio.

In view of the above, it is an object of the present invention to provide a double heterostructure semiconductor laser whose power output is not significantly limited by the gradual or catastrophic failure of partially reflecting crystal end facets.

It is a further object of the invention to provide a double heterostructure semiconductor laser which has a very narrow output frequency spectrum and that can be directly current modulated with a relatively low FM to AM ratio.

SUMMARY OF THE INVENTION

The present invention is a semiconductor laser diode which comprises first and second closely spaced parallel active waveguides. The parallel active waveguides are close enough so that they are optically coupled, i.e., the evanescent optical field of each waveguide overlaps the neighboring waveguide. Under the appropriate phase matching conditions, energy traveling in one waveguide transfers to the second guide.

Illustratively, the two waveguides extend axially between first and second partially reflecting crystal end facets of the semiconductor body comprising the laser diode. The first waveguide is terminated at the first facet with a high-reflection coating and is terminated at the second facet with an anti-reflection coating. The second waveguide is terminated at the first facet with an anti-reflection coating and is terminated at the second facet with a high reflection coating. Thus, a feedback path is defined which extends from the high reflection coating on the first facet, along part of the first waveguide, through the coupling region which separates the two waveguides, and along a portion of the second waveguide to the high-reflection coating on the second facet.

There is no operative feedback path set up in either waveguide by itself, as each waveguide has a high-reflection coating at one end and an anti-reflection coating at the other end. In other words, this is a dual channel Fabry-Perot laser, i.e., the operative feedback path involves two adjacent parallel channels and the coupling region therebetween. The dual channel Fabry-Perot feedback path provides feedback over a broad frequency range and the active layer has gain over a relatively large frequency band so that the dual channel Fabry-Perot laser has a multi-frequency Fabry-Perot type spectrum.

In the portion of each waveguide nearest the high reflection termination, i.e., in the portion of each waveguide which forms part of the feedback path, standing waves are set up. However, near the antireflecting termination of each waveguide, from which coherent radiation is emitted, no standing waves are set up and only traveling waves propagate. Thus, the above-described mechanisms which cause gradual or catastrophic failure of emitting end facets are substantially alleviated. Higher output powers may be achieved without experiencing the gradual or catastrophic failure of the facet portions from which radiation is emitted. Furthermore, even if a small amount of facet degradation does occur at the anti-reflection coated facet portions, the existence of the feedback path, and hence the existence of laser oscillations, are not affected, as the anti-reflection coated facet portions are not in or near the feedback path.

Illustratively, the dual channel feedback laser may be implemented in a double heterostructure by forming two parallel closely spaced ridges in the upper cladding layer. If the ridges are narrow enough and the active layer thin enough, the resulting waveguides will be single mode waveguides, in which case only the fundamental transverse and lateral mode will be supportable therein. Thus, the principles of the present invention enable the achievement of a high power double-heterostructure laser which operates in the fundamental transverse and lateral mode.

In an alternative embodiment, the two waveguides may be coupled by a periodically varying structure. In this case, the two waveguides have geometrically different cross-sections (e.g. they have slightly different widths) and the waves propagating therein have different phase velocities.

The frequency bandwidth Δf in which there is significant coupling (i.e. transfer) of energy between the two waveguides is $$(\Delta f)/f_o = \Lambda/L$$

where $\Lambda$ is period of the periodically varying coupling structure and L is the length of the two waveguides. The center frequency $f_o$ is given by $$f_o = [(1/v_{p1} - /v_{p2})\Lambda]^{-1}$$

where $v_{p1}$ and $V_{p2}$ are the non-identical phase velocities in the two waveguides.

The achievement of laser oscillations requires: that the bandwidth Δf for coupling of energy between the two waveguides fall inside the frequency range in which there is net positive gain and, that one of the Fabry-Perot type modes for which the dual-channel feedback path is operative fall inside the coupling bandwidth Δf. When the Fabry-Perot type mode has a frequency equal to $f_o$, $f_o$ is the frequency of oscillation. When the Fabry-Perot type mode has a frequency slightly different from $f_o$, the oscillating frequency is located in between $f_o$ and the Fabry-Perot frequency, nearer to $f_o$. Thus, the actual band for oscillations is centered about $f_o$ and is much narrower than Δf. When the Fabry-Perot frequency is not equal to $f_o$, a small amount of dispersion is introduced (i.e. the Kramer-Koenig relations are applicable), which dispersion causes the Fabry-Perot mode to be pulled toward $f_o$.

Such a laser comprising two slightly different parallel waveguides coupled by a periodic structure may be modulated with a minimum FM to AM ratio. Variations in charge carrier density because of modulation of pumping current cause compensating changes in $V_{p1}$ and $V_{p2}$, leaving $f_o$, the frequency of oscillation, unchanged. In fact, careful adjustment of the modulating current in each of the waveguides can substantially eliminate frequency modulation.

For purposes of clarity, the Figures are not drawn to scale.

DETAILED DESCRIPTION OF THE INVENTION

Figure 1:
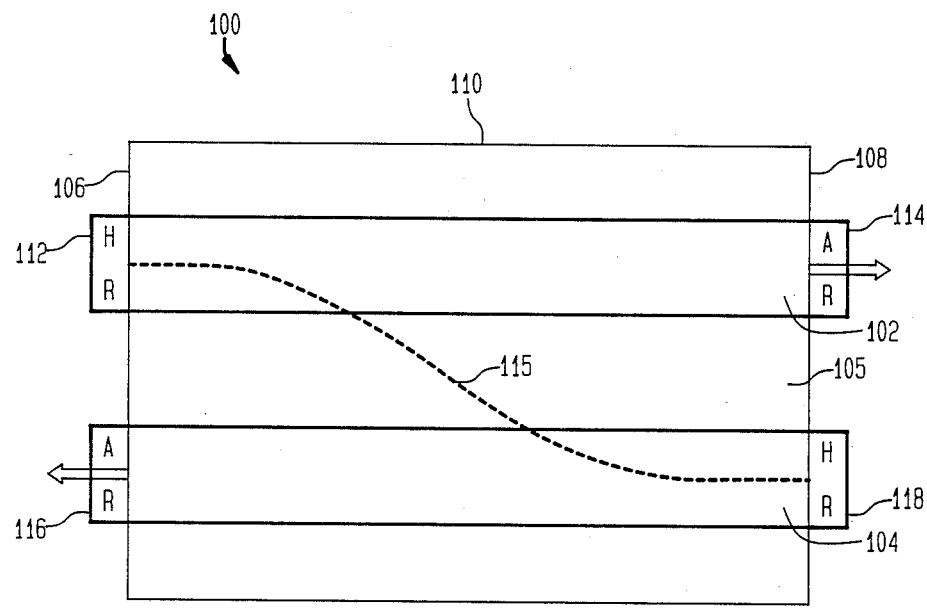
FIG. 1 schematically illustrates a dual channel Fabry-Perot laser in accordance with an illustrative embodiment of the present invention.

Turning to FIG. 1, a dual channel Fabry-Perot laser 100 is schematically illustrated. The dual channel Fabry-Perot laser 100 comprises a first active waveguide 102 and a second closely spaced and substantially parallel active waveguide 104. The active waveguides 102 and 104 are separated by a coupling region 105. The waveguides 102 and 104 are optically coupled because the evanescent optical field from each waveguide spreads out through the coupling region 105 and interacts with the optical field in the other waveguide.

Illustratively, the waveguides 102 and 104 extend between partially reflecting crystal end facets 106 and 108 of the semiconductor body 110 which forms the laser 100 of FIG. 1. Each of the waveguides is terminated at one end with a high-reflection coating and at the other end with an anti-reflection coating. More particularly, the waveguide 102 is terminated at the facet 106 with a high-reflection coating 112 and is terminated at the facet 108 with an anti-reflection coating 114. The waveguide 104 is terminated at facet 106 with an anti-reflection coating 116 and is terminated at facet 108 with a high-reflection coating 118.

The feedback necessary to sustain laser oscillations in the device 100 takes place along the path indicated by the dotted line 115 in FIG. 1. The feedback path extends from the high reflection coating 112 on facet 106 along a portion of waveguide 102, through the coupling region 105, along a portion of the waveguide 104, and finally to the high reflection coating 118 on facet 108. When the round trip gain along the feedback path exceeds losses due to mechanisms such as absorbtion and scattering, laser oscillations are sustained.

Thus, the laser 100 requires two channels 102, 104 for its feedback path, which feedback path depends on the coupling of radiation through the coupling region 105 between the waveguides 102 and 104. In other words, the laser of the present invention is a dual channel Fabry-Perot type laser. Since the dual channel feedback mechanism provides feedback over a large bandwidth and the active waveguides 102, 104 have net gain over a relatively large bandwidth, the radiation in the waveguides 102, 104 has a Fabry-Perot type spectrum.

However, standing waves are set up in the waveguides 102, 104 only near the high-reflection terminations 112, 118. Only traveling waves propagate near the anti-reflecting terminations 114, 116 of the waveguides 102, 104 through which coherent radiation is emitted. Thus, mechanisms which cause the gradual or catastrophic failure of emitting facets in conventional Fabry-Perot semiconductor diode lasers are substantially mitigated. Accordingly, the laser 100 is able to produce a higher power output than could a conventional Fabry-Perot type diode laser before experiencing gradual or catastrophic emitting facet failure.

Figure 2:
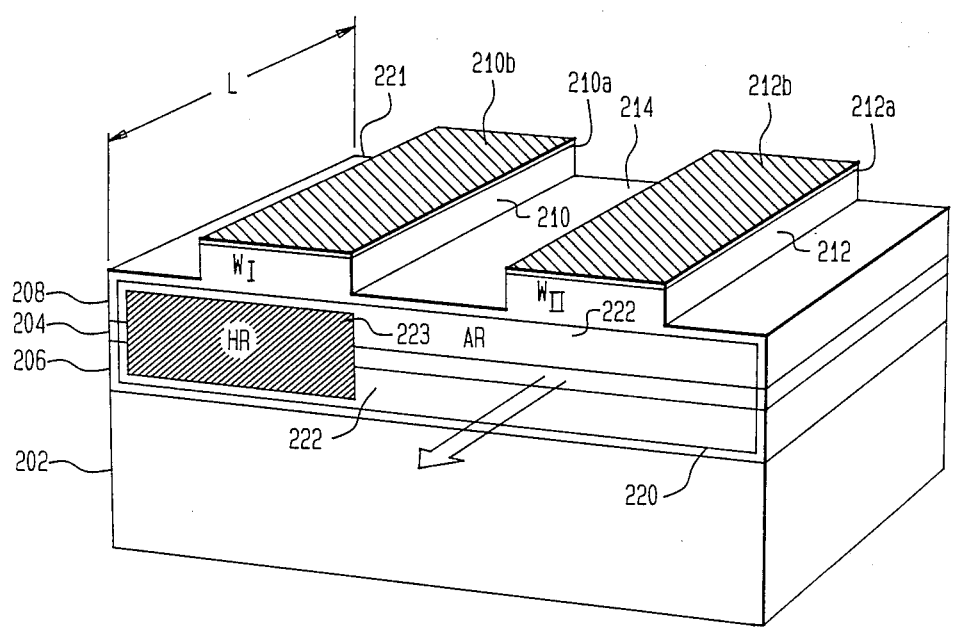
FIG. 2 illustrates a dual channel Fabry-Perot double-heterostructure laser implemented using ridge waveguide structures, in accordance with an illustrative embodiment of the present invention.

Turning to FIG. 2, a dual channel Fabry-Perot double heterostructure laser comprising a pair of parallel spaced apart ridge waveguides is illustrated. The laser of FIG. 2 operates in accordance with the principles discussed in connection with FIG. 1. Illustratively, the laser 200 of FIG. 2 is formed using the GaAs-AlGaAs material system, although other materials systems such as the InGaAsP-InP materials system may be used.

The laser 200 of FIG. 2 comprises an n-type GaAs substrate 202 which is about 150 microns thick and has a dopant concentration of about $3 \times 10^{18}$ cm$^{-3}$. A thin narrow band-gap GaAs active layer 204 is located between and contiguous with the thicker, relatively wide band gap cladding layers 206 and 208, which cladding layers are of opposite conductivity type. The cladding layers 206 and 208 are formed from $Al_xGa_{1-x}As$ where x is on the order of 0.25 to 0.35. The layer 206 is an n-type layer which has a dopant concentration of about $3 \times 10^{18}$ cm$^{-3}$ and a thickness of about 1 micron. The active layer 204 is about 0.2 microns thick and is not intentionally doped. Two ridge-shaped regions 210 and 212 are formed in the p-type cladding layer 208 to define first and second parallel fundamental mode waveguides $W_I$, $W_{II}$. The portions of the cladding layer 208 not forming the ridges have a thickness of about 0.6 microns, while the ridges 210, 212 add an additional thickness of about 0.4 microns. The layer 208 has a dopant concentration of about $3 \times 10^{18}$ cm$^{-3}$.

The first and second parallel single mode waveguides $W_I$ and $W_{II}$ defined by the ridges 212 and 210 are separated by a coupling region 214. Illustratively, the ridges 210, 212 have a width on the order of 2 microns and the coupling region 214 which separates the two ridges has a width of about 1 micron. Thus, the waveguides $W_I$ and $W_{II}$ are close enough so that the evanescent field from each waveguide overlaps with the optical field in the other waveguide.

The waveguides $W_I$ and $W_{II}$ defined by the ridges 210 and 212 extend between the partially reflecting crystal end facet 220 and another oppositely disposed parallel crystal end facet 221. The end facets 220 and 221 are separated by a length L which is illustratively on the order of 400 microns. In order to obtain the dual channel type feedback described in connection with FIG. 1, the waveguide $W_I$ defined by the ridge 210 terminates at the facet 220 with a high-reflection coating. The opposite end of the waveguide $W_I$ is terminated at the oppositely disposed facet 221 with an anti-reflection coating (not shown). The waveguide $W_{II}$ defined by the ridge 212 terminates at the facet 220 with an anti-reflection coating. The opposite end of the wave guide $W_{II}$ terminates at the facet 221 with a high-reflection coating (not shown). The high-reflection and anti-reflection coatings are formed on the facet 220 as follows. First, a dielectric anti-reflection coating 222 is placed over the entire facet. Then, the high-reflection coating is formed by depositing a metal coating 223 over that portion of the facet 220 which terminates the waveguide $W_I$. The dielectric film located under the metal prevents shorting of the diode.

Conventional p-type GaAs capping layers 210a, 212a and metallic contact layers 210b, 212b are formed on top of the ridge-shaped regions 210, 212 so that the structure shown in FIG. 2 may be forward biased. Illustratively, each capping layer 210a, 212a is about 0.2 to 0.5 microns thick and has a dopant concentration of about 1 to $2 \times 10^9$ cm$^{-3}$. Each metal contact layer 210b, 212b is illustratively formed from titanium, platinum, and gold.

The laser 200 of FIG. 1 may be manufactured as follows: A relatively thick n-type $Al_xGa_{1-x}As$ cladding layer, a relatively thin undoped GaAs active layer, a relatively thick p-type $Al_xGa_{1-x}As$ cladding layer, and a thin p-type GaAs capping layer are successively grown on the GaAs substrate 202 by use of a conventional technique such as liquid phase epitaxy or vapor phase epitaxy. The two last deposited layers are then etched so as to form the ridge-shaped structures 210, 212 which define the first and second laser waveguides $W_I$, $W_{II}$ comprising the dual channel Fabry-Perot laser 200. Each metallic contact layer 210b, 212b is deposited on the ridge-shaped structures 210, 212 by conventional techniques. In one approach the metal may be put down before etching. The metal is then used as the etching mask to form the ridges. The semiconductor body comprising the deposited layers is then cleaved to form the end facets of the laser. High-reflection and anti-reflection coatings are deposited on the cleaved facets as discussed above using conventional techniques.

When a forward bias is applied to the p-i-n structure defined by the cladding layers 206 and 208 and the active layer 204, charge carriers are injected into the active layer 204 where radiative recombination takes place. The emitted radiation is laterally confined to the regions generally underneath the ridges 210, 212 because of the effective index of refraction difference under the ridge edge-air interface. The feedback path for the laser 200 of FIG. 2 extends from the high reflection coating 223 on the facet 220, along part of the waveguide $W_I$, through the coupling region 214, and along part of the waveguide $W_{II}$ to the facet 221 where the waveguide $W_{II}$ is terminated by a high-reflection coating. When the round trip optical gain along this path exceeds losses due to mechanisms such as scattering and absorption, laser oscillations will result.

Because of the dual channel feedback path no standing waves are set up in the waveguides $W_I$, $W_{II}$ near the anti-reflection terminations of the waveguides from which the radiation emerges. Standing waves are set up only near the high-reflection terminations of the waveguides. Only traveling waves propagate near the anti-reflection terminations of the waveguides. Thus, relatively high power is transmitted through the anti-reflection terminations of the waveguides $W_I$, $W_{II}$ without gradual or catastrophic failure of the anti-reflection coated portions of the end facets. Even if a small amount of facet degradation takes place at the anti-reflection terminations, failure of the device is unlikely to occur as such degradation is not in a region which is part of the feedback path for the laser.

Because the afore-stated widths of the ridges 210 and 212 have been chosen narrow enough so that the waveguides $W_I$ and $W_{II}$ defined thereby support only the fundamental lateral mode, the laser 200 is a high power fundamental lateral mode double heterostructure laser.

Figure 3:
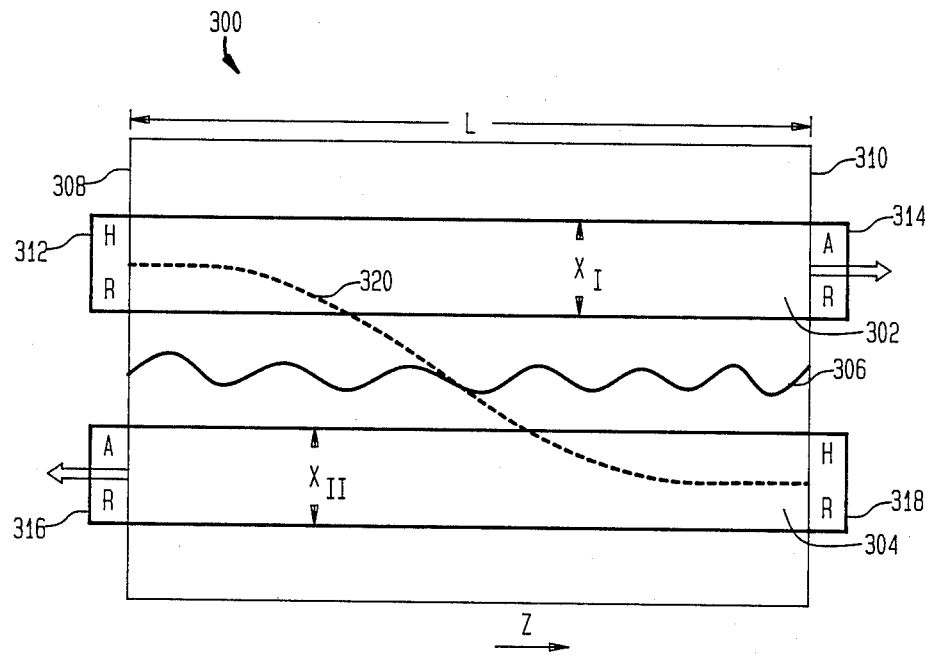
FIG. 3 schematically illustrates a dual channel Fabry-Perot laser, having two channels which are coupled by a periodic structure, in accordance with an illustrative embodiment of the present invention.

Turning to FIG. 3, a dual channel Fabry-Perot laser in which the two active waveguides are coupled by a periodic structure is schematically illustrated. The laser 300 of FIG. 3 comprises a pair of closely spaced parallel active waveguides 302 and 304. The waveguides 302, 304 are coupled by a periodic structure 306 over the interaction length L. Radiation in the waveguides 302 and 304 propagates in the z direction as indicated in FIG. 3.

The waveguides extend axially, between a pair of parallel spaced apart partially reflecting end facets 308, 310. The waveguide 302 is terminated at the facet 308 with a high reflection coating 312 and is terminated at the facet 310 with an anti-reflection coating 314. The waveguide 304 is terminated at the facet 308 by an anti-reflection coating 316 and is terminated at the facet 310 with a high-reflection coating 318.

The feedback necessary to support laser oscillations in laser 300 of FIG. 3 takes place along the path 320. This path extends from high-reflection coating 312 on facet 308, along a portion of the waveguide 302, through the periodic coupling structure 306 and along a portion of the waveguide 304 to the high-reflection coating 318 on facet 310. When the round trip gain along the path 320 exceeds losses, laser oscillations are sustained in the structure 300 of FIG. 3. Coherent radiation is emitted through one or both anti-reflection coatings 314, 316.

The radiation field in each of the waveguides is characterized by a propagation constant. $\beta_1$ denotes the propagation constant in the waveguide 302 and $\beta_2$ denotes the propagation constant in the waveguide 304. The waveguides 302, 304 have different propagation constants because they are slightly different geometrically, e.g., they have slightly different widths $X_I$, $X_{II}$. Substantial coupling of energy between the two waveguides 302, 304 takes place when $$(\beta_1 - \beta_2 \pm (2\pi)/\Lambda)L < \pi \tag{1}$$

Optimal coupling takes place when $$\beta_1 - \beta_2 = \pm 2\pi/\Lambda \tag{2}$$

where $\Lambda$ is the spatial period of the periodic structure 306. $\beta_1$ and $\beta_2$ are both functions of frequency (f) and phase velocity ($v_p$). More particularly $$\beta_1(f) = (2\pi f)/V_{p1} \tag{3a}$$

$$\beta_2(f) = (2\pi f)/V_{p2} \tag{3b}$$

where $v_{p1}$ is the phase velocity in waveguide 302 and $v_{p2}$ is the phase velocity in waveguide 304. Substituting equations (3a), (3b) into equations (1) and (2) the following set of equations is obtained:

$$|2\pi f(1/v_{p1} - 1/v_{p2}) \pm (2\pi)/\Lambda| \leq \pi/L \tag{4a}$$

$$2\pi f_o(1/v_{p1} - 1/v_{p2}) \pm (2\pi)/\Lambda = 0 \tag{4b}$$

where $f_o$ is the frequency which satisfies equation (4b), i.e., the frequency at which there is optimal coupling of energy between the two waveguides.

Combining equations (4a), (4b), we obtain:

$$|f - f_o|/f_o = \Delta f/f_o = \Lambda/2L \tag{5}$$

where $f - f_o = \Delta f$ if the frequency bandwidth in which there is significant coupling of energy between the waveguides 302, 304. Outside this bandwidth the coupling of energy between the two guides is significantly reduced.

The frequency $f_o$ is given by the equation $$f_o = [(1/v_{p1} - 1/v_{p2})\Lambda]^{-1} \tag{6}$$

Figure 4:
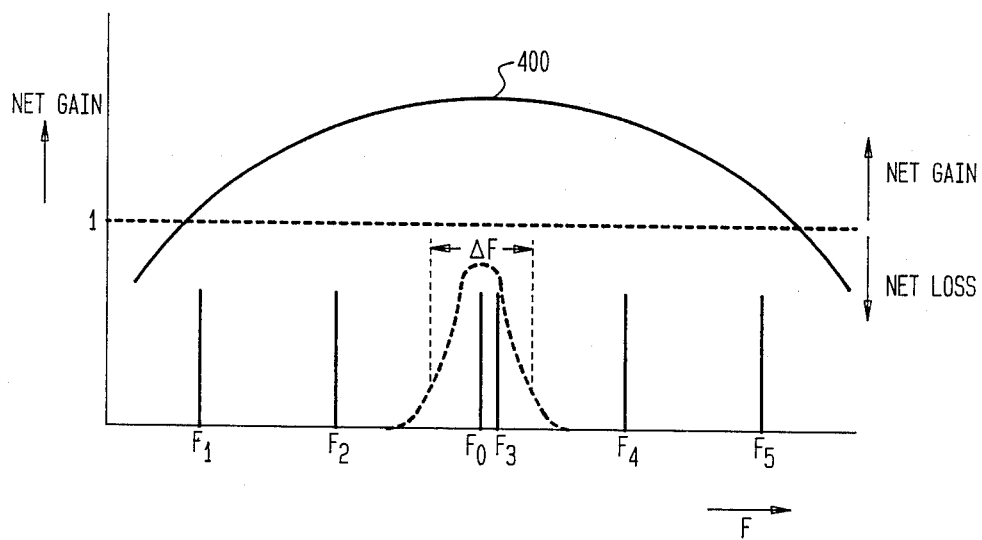
FIG. 4 illustrates the mode structure for the laser of FIG. 3.

The frequency bandwidth in which laser oscillations are sustainable in the laser structure 300 of FIG. 3 may be understood with the aid of FIG. 4. Curve 400 of FIG. 4 is a plot of the net gain of the laser 300 as a function of frequency. For laser oscillations to be sustained, the net gain must be larger than 1. The modes $F_1$, $F_2$, $F_3$, $F_4$, $F_5$, are modes which would be set up by the dual channel Fabry-Perot feedback mechanism without taking into account the coupling structure 306. The bandwidth $\Delta f$ is the bandwidth in which there is significant coupling of energy between the two waveguides. As discussed above, the center frequency of the bandwidth $\Delta f$ is $f_o$ where $f_o$ is given by equation 6 above.

In order to sustain laser oscillation in the laser 300 of FIG. 3, the bandwidth of $\Delta f$ for significant coupling of energy must overlap the bandwidth in which the net gain is greater than 1 and one of the Fabry-Perot modes such as $F_3$ must fall within the bandwidth $\Delta f$.

If $f_o$ equals $F_3$ then the frequency of oscillation is $f_o$. If $f_o$ does not equal $F_3$, $F_3$ is pulled toward $f_o$. Thus, the actual bandwidth for laser oscillations is much narrower than $\Delta f$. Such mode pulling arises when $F_3$ does not equal $f_o$ because a small amount of dispersion is introduced. The dispersion is related to the Kramers-Kroenig relations.

The laser 300 may be directly modulated with a minimum FM to AM ratio. The reason for this is as follows. When the waveguides comprising the laser 300 are current-modulated the charge carrier densities therein and hence the indices of refraction in the two waveguides are varied. Such changes in the indices of refraction cause changes in the phase velocities $v_{p1}$ and $v_{p2}$. However in the laser 300 of FIG. 3. the phase velocities $v_{p1}$ and $v_{p2}$ are changed in a compensating manner so that the oscillation frequency $f_o$ which depends on $1/v_{p1} - 1/v_{p2}$ remains substantially unchanged when direct current modulation takes place. In constrast, in a conventional distributed feedback laser the oscillation frequency is directly proportional to the phase velocity so that the frequency of oscillation changes when direct current modulation takes place.

Figure 5:
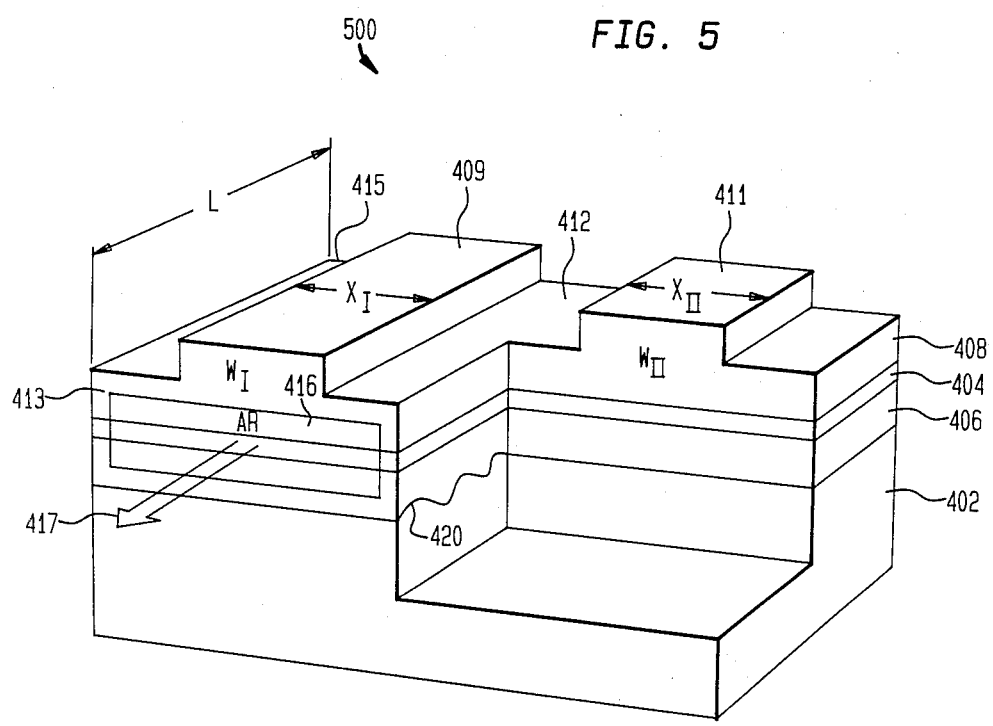
FIG. 5 is a partly perspective and partly cross-sectional view of a dual channel Fabry-Perot double-heterostructure laser comprising a pair of ridge waveguides which are coupled by a periodic structure, in accordance with an illustrative embodiment of the invention.

In FIG. 5 a dual channel double heterostructure laser 500 is illustrated. The laser 500 of FIG. 5 operates in accordance with the principles discussed in connection with FIGS. 3 and 4 above. The two waveguides comprising the laser 500 are coupled by a periodic structure so that laser oscillations are sustainable only in a narrow bandwidth as discussed above.

In a preferred embodiment, the laser 500 is formed using the GaAs-AlGaAs materials system. The laser 500 comprises an n-type GaAs substrate 402 having a thickness of about 150 microns and a dopant concentration of about $3 \times 10^{18}$ cm$^{-3}$. A periodic coupling structure 420 is formed in the substrate 402 by etching a series of parallel ridges and grooves, which ridges and grooves extend perpendicular to the longitudinal axis of the laser 500. A thin relatively narrow bandgap GaAs active layer 404 is located between and contiguous with the thicker, relatively wide bandgap cladding layers 406 and 408 of opposite conductivity type, which cladding layers are formed from $Al_xGa_{1-x}As$, where x is on the order of about 0.25 to 0.35. The cladding layer 406, the active layer 404, and the cladding layer 408 are successively deposited on the etched substrate 402 by conventional techniques such as vapor phase epitaxy or liquid phase epitaxy. The cladding layer 406 is an n-type layer having a thickness of about 1 micron and a dopant concentration of about $3 \times 10^{18}$ cm$^3$. The active layer 404 is about 0.2 microns thick and is not intentionally doped. The cladding layer 408 is a p-type layer which also has a dopant concentration of $3 \times 10^{18}$ cm$^{-3}$.

Ridges 409 and 411 are formed integrally with the cladding layer 408. The portions of the cladding layer 408, not forming the ridges 409, 411 have a thickness of about 0.6 microns, while the ridges 409, 411 add an additional thickness of about 0.4 microns. The ridges 409 and 411 have slightly different widths $X_I$ and $X_{II}$ respectively, so that the waveguides $W_I$ and $W_{II}$ defined thereby have different propagation constants. Illustratively the ridge 409 has a width $X_I$ of about 3 microns and the ridge 410 has a width $X_{II}$ of about 4 microns. These widths are such that the resulting waveguides $W_I$, $W_{II}$ are single mode waveguides which support only the fundamental lateral mode. The ridges 409, 410 are separated by a region 412 of width 2 microns. The two waveguides $W_I$ and $W_{II}$ defined by the ridges 409 and 411 are optically coupled by the periodic structure 420 which, as previously indicated, is formed at the interface between substrate 402 and the cladding layer 406. The periodic structure 420 has an axial periodicity of about 10 microns and a width which should be about 10 microns or greater, i.e., enough to overlap both waveguides.

A p-type GaAs capping layer and a metallic layer are formed on top of the ridges 409, 411 so that the p-i-n structure defined by cladding layers 406, 408 and active layer 404 can be forward biased to apply a pumping current to the active layer.

The waveguides $W_I$, $W_{II}$ defined by the ridges 409, 411 extend axially between a partially reflecting end facet 413 and an oppositely disposed partially reflecting end facet 415. The facets 413, 415 are separated by a length L of about 400 microns. Illustratively, the waveguide $W_I$ defined by ridge 409 terminates at facet 413 with an anti-reflection coating 416 through which coherent beam 417 emanates. The opposite end of the waveguide $W_I$ terminates at the facet 415 with a high-reflection coating (not shown). Similarly, the waveguide $W_{II}$ defined by ridge 411 terminates at the facet 413 with a high reflection coating (not shown) and terminates at the facet 415 with an anti-reflection coating (not shown). The anti-reflection and high-reflection coatings are formed on the facets 413, 415 in the manner discussed in connection with FIG. 2.

In the laser 500 of FIG. 5, laser oscillations are sustainable in a narrow frequency band centered about a frequency $f_o$ given by equation (6) above, which frequency is relatively insensitive to index of refraction changes that occur during direct current modulation of the laser. Thus, the laser of FIG. 5 may be directly modulated with a minimum FM to AM ratio.

Finally, the above described embodiments of the invention are intended to be illustrative only. Numerous alternative embodiments may be devised by those skilled in the art without departing from the spirit and scope of the claims which follow. In particular, the periodic coupling may be achieved by varying the width of the space between the ridges periodically in phase along the interaction path. Furthermore, instead of using ridge-like structures to define first and second waveguides in the dual channel Fabry-Perot lasers of the present invention, alternative structures such as inverted ribs or V-groove structures may be utilized to define such waveguides.

I claim:

1. A semiconductor diode laser comprising:

a substrate, a plurality of layers fabricated on said substrate, said layers including an active layer capable of emitting radiation when a pumping current is applied thereto, a first active waveguide defined in said active layer, a second active waveguide defined in said active layer, electrode means connected to said layers for applying said pumping current, a coupling region defined in said active layer between said first and second active waveguides so that said waveguides are optically coupled, and means for providing feedback for radiation emitted in said first or second active waveguides so that laser oscillations may be supported therein, said means providing a feedback path including a portion of said first active waveguide, said coupling region and a portion of said second active waveguide.

2. The laser of claim 1 wherein said first and second active waveguides extend between first and second parallel spaced apart partially reflecting end facets of a semiconductor body, said first active waveguide being terminated at said first facet with a high-reflection coating and at said second facet with an anti-reflection coating, said second active waveguide being terminated at said first facet with an anti-reflection coating and at said second facet with a high-reflection coating.

3. The laser of claim 1 wherein said coupling region comprises a distributed periodic structure, and wherein said first and second active waveguides have different propagation constants and said first and second active waveguides are optically coupled by said distributed periodic structure, whereby said laser can be directly modulated to produce a modulated optical output signal.

4. The laser diode of claim 1 wherein said first and second active waveguides are single mode waveguides.

5. A high power double-heterostructure semiconductor laser diode comprising:

a substrate, a plurality of layers fabricated on said substrate, said layers including first and second cladding layers of opposite conductivity type, and an active layer located between said cladding layers, said active layer being capable of the stimulated emission of radiation when a pumping current is supplied thereto, means for defining first and second optically coupled parallel waveguide regions in said active layer for laterally guiding said radiation, means connected to said layers for receiving said pumping current, and first and second parallel spaced apart partially reflecting end facets, said waveguide regions extending between said end facets, said first waveguide region being terminated at said first end facet with a high-reflection coating and at said second end facet with an anti-reflection coating, said second waveguide region being terminated at said first end facet with an anti-reflection coating and at said second end facet with a high-reflection coating, said radiation being emitted from said laser diode through at least one of said anti-reflection coatings.

6. The laser of claim 5 wherein said means defining said waveguide regions includes a pair of spaced apart ridges formed in one of said cladding layers and extending between said end facets.

7. A double heterostructure semiconductor laser diode which can be directly modulated with a relatively small FM to AM ratio comprising a substrate, a plurality of layers fabricated on said substrate, said layers including first and second cladding layers of opposite conductivity type, and an active layer located between said cladding layers, said active layer being capable of the stimulated emission of radiation when a pumping current is supplied thereto, means for defining first and second non-identical parallel waveguide regions in said active layer for laterally guiding said radiation, electrode means for receiving said pumping current, a periodic structure for optically coupling said first and second waveguide regions, and first and second parallel spaced apart partially reflecting end facets, said first and second waveguide regions extending between said end facets, said first waveguide region being terminated at said first end facet with a high-reflection coating and at said second end facet with an anti-reflection coating, said second waveguide regin being terminated at said first end facet with an anti-reflection coating and at said second end facet with a high-reflection coating, said laser being capable of supporting laser oscillations only in a narrow bandwidth centered about a frequency which is relatively insensitive to changes in pumping current.

8. The laser of claim 7 wherein said waveguide defining means comprises first and second ridges formed in one of said cladding layers and extending between said end facets, said first and second ridges having different widths.

9. A semiconductor laser diode comprising:

a substrate, a plurality of layers fabricated on said substrate, said layers including an active layer capable of producing radiation when a pumping current is supplied thereto, first and second geometrically non-identical spaced apart parallel active waveguides defined in said active layer, means for receiving said pumping current, a coupling region defined in said active layer between said first and second active waveguides and including a periodic coupling structure therein, means defining a feedback path for radiation in said first and second active waveguides comprising a portion of said first active waveguide, said coupling region, and a portion of said second active waveguide, said feedback path restricting the oscillation frequency of said laser diode to a narrow band centered about a frequency which is substantially insensitive to changes in pumping current so that said laser is capable of being modulated with a relatively small FM to AM ratio.

10. A semiconductor laser diode comprising:

a substrate, a plurality of layers fabricated on said substrate, said layers including an active layer capable of emitting radiation when a pumping current is supplied thereto, electrode means associated with said active layer for receiving said pumping current, first and second parallel spaced apart partially reflecting end facets, and first and second coupled active waveguides extending between said end facets, said first active waveguide being terminated at said first end facet with an anti-reflection coating, and at said second end facet with a high-reflection coating, and said second active waveguide being terminated at said first end facet with a high-reflection coating and at said second end facet an anti-reflection coating to define a feedback path extending from said high-reflection coating on said first end facet, to said high-reflection coating on said second end facet, so that no standing waves are set up in said active waveguides near said anti-reflection coatings, radiation being emitted through at least one of said anti-reflection coatings.

* * * * *